United States Patent [19]

Van Der Mast et al.

[11] Patent Number: 5,578,822
[45] Date of Patent: Nov. 26, 1996

[54] PARTICLE-OPTICAL APPARATUS COMPRISING A DETECTOR FOR SECONDARY ELECTRONS

[75] Inventors: Karel D. Van Der Mast, Eindhoven; Pieter Kruit, Delft; Kars Z. Troost; Alexander Henstra, both of Eindhoven, all of Netherlands

[73] Assignee: U.S. Philips Corporation, New York, N.Y.

[21] Appl. No.: 419,493

[22] Filed: Apr. 10, 1995

[30] Foreign Application Priority Data

Apr. 12, 1994 [EP] European Pat. Off. .............. 94200983

[51] Int. Cl.[6] .......................... H01J 37/14; H01J 37/244
[52] U.S. Cl. ............................................ 250/310; 250/309
[58] Field of Search ........................... 250/310, 396 ML, 250/397, 309

[56] References Cited

U.S. PATENT DOCUMENTS

| | | | |
|---|---|---|---|
| 4,785,176 | 11/1988 | Frosien et al. | 250/310 |
| 4,831,266 | 5/1989 | Frosien et al. | 250/310 |
| 4,926,054 | 5/1990 | Frosien | 250/310 |
| 5,023,457 | 6/1991 | Yonezawa | 250/310 |
| 5,079,428 | 1/1992 | Da Lin et al. | 250/396 ML |
| 5,241,176 | 8/1993 | Yonezawa | 250/396 ML |
| 5,412,209 | 5/1995 | Otaka et al. | 250/310 |

FOREIGN PATENT DOCUMENTS 2-24336  2/1990  Japan.

OTHER PUBLICATIONS

Magnetic Through–the–lens Detection in Electron Microscopyo and Spectroscopy Part I, P. Kruit, Advances in Optical and Electron Microscopy, vol. 12, ISBN 0–12–029912–7, 1991.

Primary Examiner—Bruce C. Anderson
Attorney, Agent, or Firm—Leroy Eason

[57] ABSTRACT

The focusing device 8 for the primary beam in a scanning electron microscope (SEM) consists in known manner of a combination of a magnetic gap lens 34 and a monopole lens 38. The secondary electrons released from the specimen are detected in accordance with the invention by a detector whose deflection unit 52, or the actual detector 64, 66, is arranged in a field-free space between the gap lens and the monopole lens. This space is rendered field-free by a screening plate 44 arranged underneath the gap lens. In order to achieve a high detector efficiency and a large field of vision, the pole tip of the focusing device 8 is provided with an attraction electrode 42 whose potential is higher than that of the specimen.

7 Claims, 2 Drawing Sheets

PARTICLE-OPTICAL APPARATUS COMPRISING A DETECTOR FOR SECONDARY ELECTRONS

BACKGROUND OF THE INVENTION

1. Field of the Invention

The invention relates to a particle-optical apparatus which comprises a particle source for producing a primary beam of electrically charged particles which propagate along an optical axis of the apparatus, the beam being controlled to scan a specimen to be examined. The apparatus further comprises a focusing device for forming a beam focus in the vicinity of the area in which the specimen is to be arranged, which focusing device is constructed as a combination of a gap lens and a monopole lens whose lens fields have been shifted relative to one another along the optical axis, and a detection device for detecting electrically charged particles originating from the specimen, at least a part of said detection device being situated within the focusing device.

2. Description of the Related Art

An apparatus of this kind is known from Japanese Patent Application No. 2-24336 filed, on Feb. 2, 1990, and published Oct. 14 1991 under No. 3-230464.

The apparatus described in the cited Japanese Patent Application is a scanning electron microscope (SEM). Microscopes of this kind are used to form electron optical images of a specimen by scanning a focused electron beam across the specimen. The known apparatus comprises a beam focusing device formed by a combination of a conventional magnetic gap lens and a monopole lens.

The lens field in the conventional magnetic gap lens is generated by a gap in the iron circuit of the lens; the lens field in the monopole lens is generated between an end of the iron circuit of the lens and its vicinity, notably the specimen to be examined in the apparatus. The lens field of the magnetic gap lens is situated above the lens field of the monopole lens in this known apparatus.

Lenses of the monopole type have an iron circuit which at the end facing the specimen is shaped as a funnel which is rotationally symmetrically about the optical axis. A lens coil provides excitation of this lens in such a manner that the magnetic field emanates from the pole material at the area of the narrowest part of the funnel. The required lens effect is thus obtained at that area, offering the known advantage of this type of lens that the lens effect occurs in an environment in which pole material of the electron lens is absent. This lens can therefore be used to make electron optical images of a specimen by scanning a focused electron beam formed by the lens across the specimen. This type of lens is thus customarily used in scanning electron microscopes. Therein, the specimen to be examined is rigidly arranged relative to the lens pole, for example at a distance of 1 mm from the end of the funnel-shaped lens pole.

The accelerating voltage of the electron beam in a SEM is chosen in dependence on the nature of the specimen to be examined. This accelerating voltage must have a comparatively low value (of the order of magnitude of 1 kV) in order to counteract charging of the specimen by the primary electron beam as much as possible. This could occur, for example during a study of electrically insulating layers in integrated electronic circuits or in the case of given biological specimens. Other specimens, however, require a higher accelerating voltage, for example of the order of magnitude of 30 kV. For these high accelerating voltages the resolution (of the order of magnitude of 1 nm) of a gap lens suffices; however, it is a known property of a gap lens that the chromatic aberration of this type of lens unacceptably degrades the resolution in the case of said lower accelerating voltages. For such low accelerating voltages a monopole lens is required which offers a suitable resolution (again of the order of magnitude of 1 nm).

In a SEM a specimen is usually observed by studying secondary electrons of low energy (of the order of magnitude of 5–50 eV) released from the specimen by the primary electron beam. These low-energetic electrons are accelerated in the direction of a detector. When use is made of a monopole lens which produces a magnetic field which extends as far as the specimen, these electrons perform a spiral-like motion in the vicinity of the specimen, around a magnetic field line which is tangent to the specimen at the area where the electron leaves the specimen. However, if a detector is arranged in the monopole lens, it will be reached only by those secondary electrons which have propagated along a magnetic field line starting from a point within the monopole lens; all other secondary electrons are not "seen" by the detector. Because of this effect, the field of vision of an electron microscope comprising a monopole lens is limited to approximately $0.1 \times 0.1$ mm$^2$ in the case of a free working distance of 1 mm. Because of this small field of vision of the monopole lens, the use of the gap lens (having a field of vision of a few mm$^2$) is important in the case of low accelerating voltages: it is then possible to select a region of the specimen to be examined by means of a large field of vision, after which this region can be studied in detail by means of the (high-resolution) monopole lens. Combining the monopole lens and the conventional gap lens so as to form one focusing device thus enables selection of the required accelerating voltage for a given specimen. The excitation of the gap lens can be deactivated and the monopole lens can be excited without it being necessary for the user of the microscope to make any changes in the apparatus (notably without it being necessary to change the vertical position of the specimen).

A further advantage of this focusing device consists in that it offers space to accommodate a detector for secondary electrons. Secondary electrons emanating from the specimen at the lens side can then be observed by this built-in detector.

In the known SEM the detector for secondary electrons is mounted above the monopole field as well as above the lens field of the gap lens. This arrangement of the detector has a drawback which will be described hereinafter.

Secondary electrons released from the specimen by the primary beam exhibit a directional distribution which has a maximum for an angle of 45° relative to the specimen surface, whereas only a very small fraction of the secondary electrons emanates in the direction perpendicular to this surface. (For a more detailed description of the directional dependency of the secondary electrons reference is made to a book by L. Reimer "Scanning Electron Microscopy" (notably page 186), Springer Verlag, 1985, ISBN 3-540-13530-8.)

The drawback of the known configuration of lenses and detector arises in that the electrons must pass the lens field of the gap lens in order to reach the detector. If only this lens is in the excited condition, i.e. when the electron beam is focused on the specimen by this lens, the lens field of this lens will be comparatively strong and the magnetic field at the area of the specimen will be many tens of times weaker or may even be considered to be substantially equal to zero for all practical purposes. When external electrons (i.e. electrons from the specimen in which the magnetic field strength is very low) are accelerated into the lens field, only those electrons which propagate substantially parallel to the optical axis can actually traverse the lens field. All other electrons are forced to return in the lens field and, therefore, will not reach the detector. This phenomenon is known as the magnetic bottle effect. (For a more detailed description of this phenomenon, reference is made to a publication "Magnetic Through-the-lens Detection in Electron Microscopy, part I" by P. Kruit in "Advances in Optical and Electron Microscopy", Vol. 12, ISBN 0-12-029912-7, 1991, Academic Pres Ltd, notably chapter I "Introduction" and the associated FIG. 1.) In the case of secondary electrons, therefore, only electrons which have emanated from the specimen surface in the perpendicular direction can traverse the lens field so as to reach the detector. As has already been described, this applies to only a small fraction of the total number of secondary electrons, so that the detection efficiency will be very low because of this phenomenon.

SUMMARY OF THE INVENTION

It is an object of the invention to provide a particle optical apparatus of the kind set forth in which a much higher detector efficiency can be achieved.

To this end, in accordance with a first aspect of the invention the apparatus is characterized in that a substantially field-free space is present between the lens fields of the gap lens and the monopole lens, and that the part of the detection device which is situated within the focusing device comprises a deflection unit for deflecting the particles originating from the specimen into the detection device, said deflection unit being arranged in the field-free space.

Because the detection unit is arranged in the field-free space, the lens fields and the deflection fields will not disturb one another. The secondary electrons need no longer traverse the lens field of the gap lens, so that all electrons entering the focusing device can indeed be transported to a detector in the detection device by the deflection unit. Such a deflection unit may be formed, for example by a system of two stacked electrostatic dipoles of equal but opposed field strength. Such a system offers the advantage that the primary beam is not or only hardly influenced thereby. (In this respect see copending now allowed application Ser. No. 08/404,706, filed Mar. 15, 1995, assigned to the present assignee.

According to a second aspect of the invention, the apparatus is characterized in that the part of the detection device which is situated within the focusing device comprises a plate-shaped detector with a symmetry axis for converting the flow of secondary electrons into a detectable signal, which detector is provided with a central aperture to allow passage of the primary beam and is arranged in the field-free space in such a manner that its symmetry axis coincides with the optical axis.

A plate-shaped detector may be formed as a flat plate or, for example a conically bent plate. A conically shaped detector is required, for example when the detector surface is to be adapted to the external shape of the monopole lens which, generally speaking, also is conical. When the detector is shaped as a flat plate, a so-called channel plate can be used for the detector or a scintillator crystal succeeded by an optoelectric transducer. These detector elements can then be arranged in such a manner that their symmetry axis coincides with the optical axis. However, they must then be provided with an aperture so as to allow unimpeded passage of the primary beam. A scintillator detector can also be used when the detector surface is to be conical. When use is made of a detector which is entirely within the focusing device, a passage through the wall of the focusing device is not or only hardly necessary. Only power supply and signal leads of small thickness are required to operate the detector. These wires can be fed through an aperture of minimum dimensions which, moreover, is provided in a location in which they do not disturb the focusing lens field.

It is to be noted that the cited Japanese Patent document discusses the possibility of arranging the detector between the gap lens and the monopole lens. However, this possibility is unconditionally rejected therein on the basis of the fact that the magnetic flux density is high in the vicinity of the end of the monopole lens. This is because the provision of a bore for a detector would cause asymmetry of the magnetic field, giving rise to a "bad axis" which would have an adverse effect on the imaging quality of the apparatus. The mention in that document of the possibility of this way of positioning in combination with the prompt rejection of this possibility constitutes for the person skilled in the art a reasoned statement dissuading this person from practising the technical teaching of the document (EPO Decision No. T26/85).

In conformity with a further feature of the invention, the apparatus is characterized in that for a passage of a portion of the detection device a bore is provided in the wall of the focusing device, which wall is provided with at least one further bore, said bores being symmetrically distributed over the circumference of the wall.

In cases where a disturbance of the field of the monopole lens by a bore for the detector is still to be feared, this problem can be circumvented by providing the wall with a number of additional holes, the wall thickness being chosen so that magnetic saturation cannot occur, not even in the vicinity of these holes. This step is based on the idea that on the desired, rotationally symmetrical field there is thus superposed a multipole field (n-pole field) whose effect decreases by the $n^{th}$ power in the vicinity of the optical axis.

A field-free space between the gap lens and the monopole lens can be achieved in conformity with a further feature according to the invention in that the focusing device is provided with a screening plate for screening the lens field of the gap lens, which screening plate is arranged between the lens field of the gap lens and the deflection unit of the detector and is provided with a bore at the area of the optical axis, which bore has a diameter which is smaller than that of the bore in the gap lens.

In conformity with a further feature according to the invention, the apparatus is characterized in that the focusing device comprises a funnel-shaped end with an opening at the area of the optical axis, in the vicinity of said opening there being arranged an attraction electrode for application of an electric potential which is positive relative to the potential of the specimen.

Should an insufficient number of secondary electrons enter the focusing device in given circumstances (for example, in case the gap lens is excited and the opening at the end at the same time has a comparatively small cross-section), an attraction electrode can contribute to an increased "yield" of secondary electrons for the detection device.

Experiments have shown that an advantageous embodiment of the attraction electrode is characterized in that it is shaped as a funnel whose axis coincides with the axis of the opening of the focusing device.

DESCRIPTION OF THE DRAWINGS

These and other, more detailed aspects of the invention will be described and illustrated with reference to the Figures. Therein.

DESCRIPTION OF THE PREFERRED EMBODIMENTS

Figure 1:
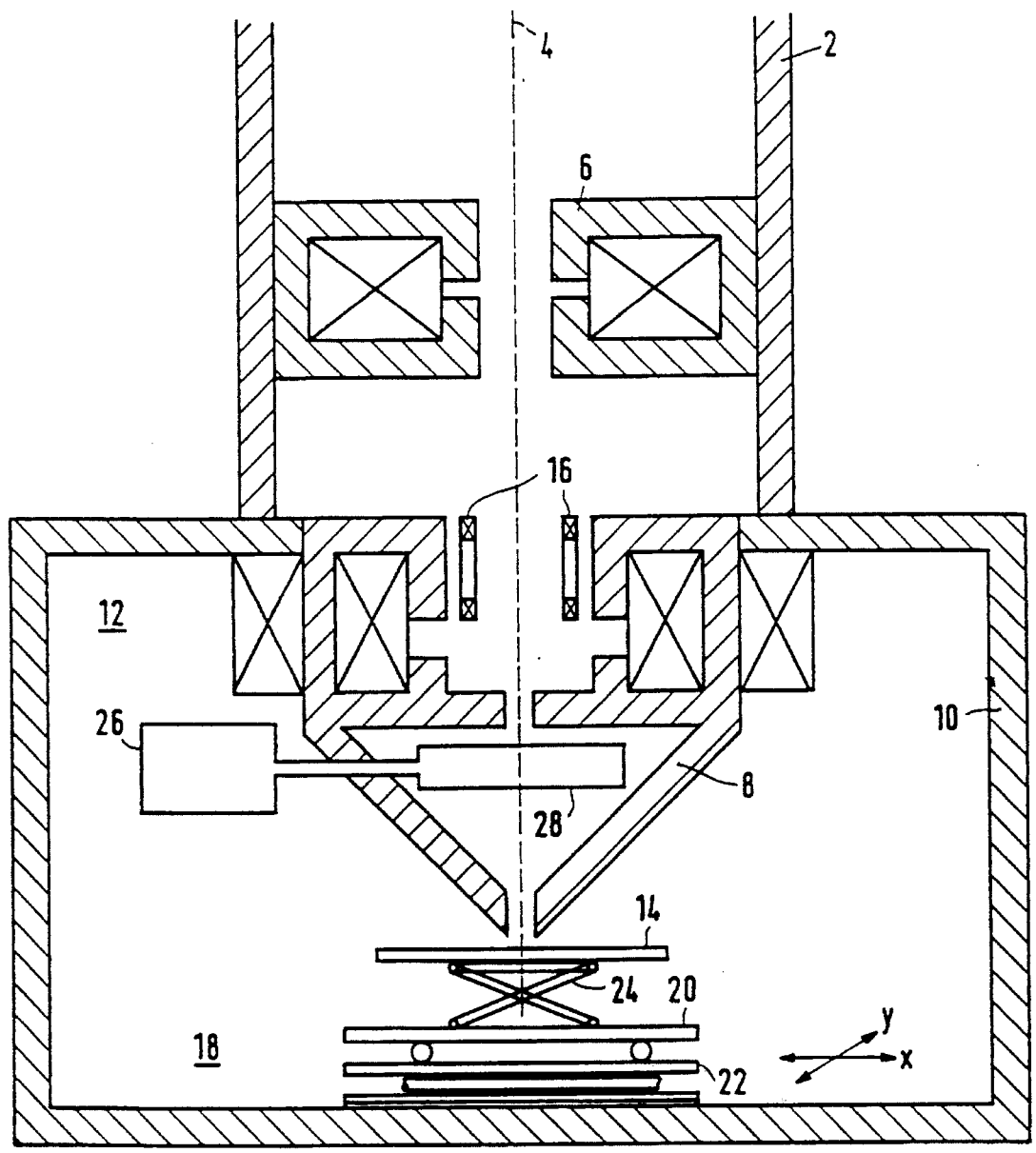
FIG. 1 shows diagrammatically a particle-optical apparatus in which the focusing device and the detector are arranged in accordance with the invention.

FIG. 1 shows a particle-optical instrument in the form of a part of a column 2 of a scanning electron microscope (SEM). As is customary, in this instrument a beam of electrons is produced by an electron source (not shown in the Figure), which beam propagates along the optical axis 4 of the instrument. This electron beam can traverse one or more electromagnetic lenses, such as a condenser lens 6, after which it reaches the focusing device 8. The focusing device, to be described in detail hereinafter with reference to the FIGS. 2 and 3, forms part of a magnetic circuit which is also formed by the wall 10 of the specimen chamber 12. The focusing device 8 is used to form an electron beam focus whereby the specimen 14 is scanned. Scanning is performed by moving the electron beam across the specimen, in the x direction as well as in the y direction, by means of scan coils 16 provided in the focusing device 8. The specimen 14 is accommodated on a specimen table 18 which comprises a support 20 for the x displacement and a support 22 for the y displacement. A desired area of the specimen can be selected for examination by means of these two supports. The specimen table 18 also comprises a tilting device 24 for tilting the specimen, if desired. From the specimen there are released secondary electrons which move back in the direction of the focusing device 8. These secondary electrons are detected by a detection device 26, 28 which is to be described hereinafter and which is accommodated within this focusing device. From the detection device there is derived a signal which can be used to form an image of the specimen, for example by means of a cathode ray tube (not shown in the Figure).

Figure 2:
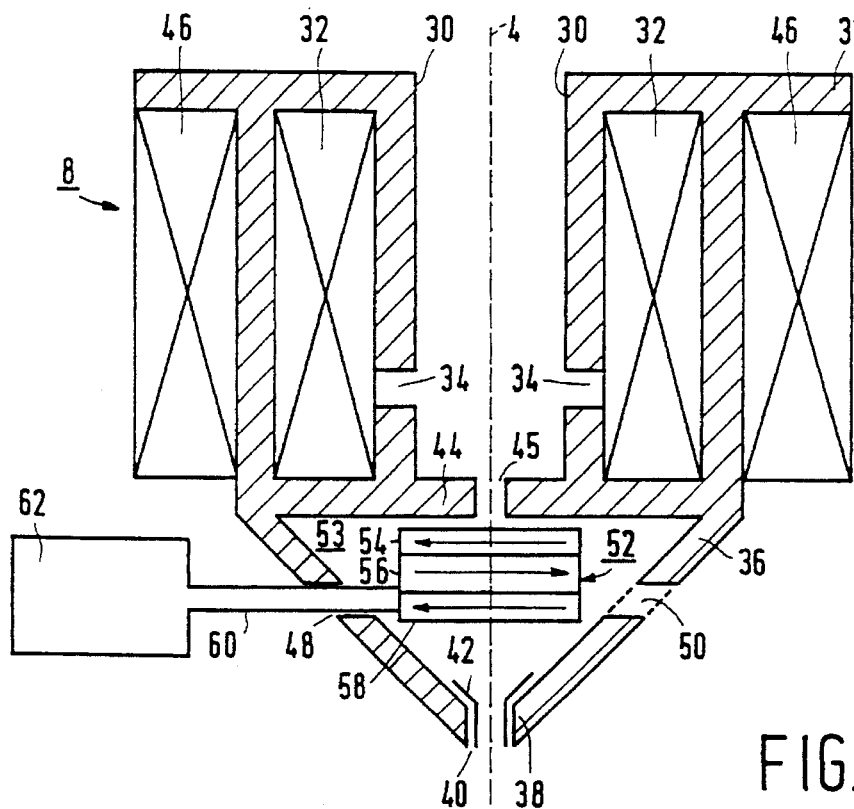
FIG. 2 is a sectional view of a focusing device for a SEM in which a deflection coil for a detector is arranged in a field-free space.
Figure 3:
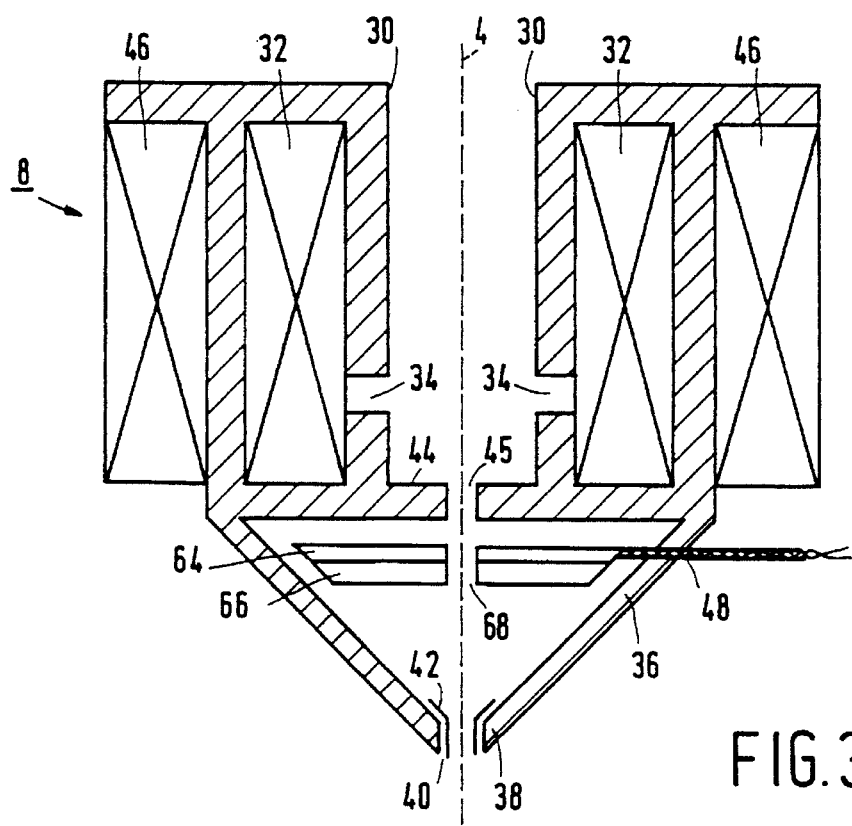
FIG. 3 is a sectional view of a focusing device for a SEM in which a plate-shaped detector is arranged in a field-free space.

FIGS. 2 and 3 are more detailed representations of a focusing device 8 for use in an apparatus as shown in FIG. 1. The shaded part of these Figures is situated rotationally symmetrically around the optical axis 4. The focusing device consists of a gap lens and a monopole lens. The gap lens is formed by an iron circuit 30 with a gap 34. A magnetic lens field is generated at the area of the gap 34 in known manner by excitation of the coil 32; the coil 46 is not switched on in that case. The focusing device 8 can also be excited as a monopole lens. In that case the coil 32 is not excited whereas a current is applied to the coil 46. In that case the magnetic field lines extend from the iron part 31, via the funnel-shaped end 36, to the pole tip 38. From this pole tip the field lines cross over to the specimen (not shown in this Figure), after which they return to the iron part 31 via, for example the wall 10 of the specimen chamber 12. When the focusing device is excited in this manner, the lens field is situated directly below the pole tip 38.

Between the lens field at the area of the gap 34 of the gap lens and the lens field of the monopole lens there is provided a screening plate 44 for screening the lens field of the gap lens. This screening plate is provided with an aperture 45 at the area of the optical axis 4 in order to allow passage of the primary beam. Thus a field-free space 53 is created in which parts of the detection device can be arranged.

The end 38 of the focusing device 8 is shaped as a funnel with a bore 40 for allowing passage of the primary beam and of the secondary electrons. In order to introduce the secondary electrons into the focusing device with a sufficiently high yield, notably in the case of focusing of the primary beam by the gap lens, there is provided a funnel-shaped attraction electrode 42. This electrode receives a sufficiently high electrostatic potential so as to move the secondary electrons into the aperture 40. This attraction electrode also offers the advantage that secondary electrons originating from a comparatively large distance from the optical axis can still be moved to within reach of the detector. Computer simulations have shown that an image field of $1 \times 1$ mm$^2$ can thus be realised on the specimen, 80% of the secondary electrons still being detected at the edge of the image field.

In FIG. 2 the part of the detection device which is situated within the focusing device is formed by an assembly 52 of electrostatic dipole fields. This assembly constitutes the deflection unit for deflecting the particles from the specimen into the detection device. In an attractive embodiment these dipole fields are generated by three electrostatic dipoles 54, 56 and 58. The central dipole then generates a field which is twice as strong at the area of the optical axis as the field of the other two dipoles 54 and 58. This configuration hardly influences the primary beam, whereas the secondary electrons originating from the specimen are efficiently guided to the actual detector 62, via the passage 60, by the field of the dipole 58. The passage 60 extends via an opening 48 in the wall 36 of the focusing device 8. In order to prevent the lens field at the area of the pole tip 38 from being affected by the presence of the opening, a further number of (preferably equally large) holes can be provided in the circumference of the wall 36 in a symmetrically distributed fashion. The thickness of the material at the area of these holes must then be chosen so that magnetic saturation cannot occur during operation of the focusing device. It has been found in practice that a number of four holes suffices to prevent disturbances of the lens field.

The part of the detection device which is situated within the focusing device in FIG. 3 is formed by an assembly of a channel plate 66 and an actual detector, for example a scintillator or an anode target plate. Because the actual detection of the secondary electrons then takes place entirely within the focusing device 8, no passage will be required for the deflected secondary electrons. It may at the most be necessary to pass the electric conductors for excitation of the detector and for extracting the signal through the wall. However, comparatively small holes suffice for this purpose, because these conductors may be very thin. If necessary, these conductors can also be routed differently, for example along the lens coils 32.

We claim:

1. A particle-optical apparatus comprising:

a particle source for producing a primary beam of electrically charged particles which propagate along an optical axis of the apparatus;

means for deflecting the beam to cause it to scan a specimen to be examined;

focusing means for bringing the beam into focus in the vicinity of said specimen, said focusing means being a combination of a gap lens and a monopole lens having lens fields which are shifted relative to one another along said optical axis;

a detection device for detecting electrically charged particles originating from the specimen, at least a part of said detection device being situated within said focusing means;

a screening plate between the gap lens and the monopole lens for establishing a substantially field-free space between the lens fields thereof; and said part of the detection device which is situated within said focusing means is also situated within said field-free space.

2. A particle-optical apparatus as claimed in claim 1, wherein said detection device includes a particle detector, and said part of the detection device which is situated within said focusing means is a deflection unit for deflecting the flow of particles originating from the specimen into said particle detector.

3. A particle-optical apparatus as claimed in claim 2, wherein said particle detector and said part of the detection device which is situated within said focusing means are connected by a portion of said detection device which passes through a bore in a wall of said focusing means, said wall also having at least one further bore therein, said bores being symmetrically distributed in said wall.

4. A particle-optical apparatus as claimed in claim 1, wherein said part of the detection device which is situated within said focusing means comprises a plate-shaped detector for converting the flow of particles originating from the specimen into a detectable signal, said detector having a central aperture therein to permit passage of the primary beam, and having an axis of symmetry which coincides with said optical axis.

5. A particle-optical apparatus as claimed in claim 1, wherein said screening plate is arranged between the lens field of the gap lens and said part of said detection device which is situated within said focusing means, and has a bore therein at the area of said optical axis of smaller diameter than the axial bore in said gap lens.

6. A particle-optical apparatus as claimed in claim 1, wherein said focusing means has a funnel-shaped end having an opening therein at the area of said optical axis, and further comprising an attraction electrode in the vicinity of said opening and situated at least partly within said focusing means to receive an electric potential which is positive relative to the potential of said specimen.

7. A particle-optical apparatus as claimed in claim 6, wherein said attraction electrode is funnel-shaped and has an axis which coincides with said optical axis.

\* \* \* \* \*